(12) United States Patent
Chen et al.

(10) Patent No.: US 10,855,056 B2
(45) Date of Patent: Dec. 1, 2020

(54) POWER AND BRIGHTNESS SCALING IN FIBER COUPLED DIODE LASERS USING DIODES WITH OPTIMIZED BEAM DIMENSIONS

(71) Applicant: nLIGHT, Inc., Vancouver, WA (US)

(72) Inventors: Zhigang Chen, Portland, OR (US); David Martin Hemenway, Beaverton, OR (US); Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/867,540

(22) Filed: Jan. 10, 2018

(65) Prior Publication Data

US 2018/0198258 A1 Jul. 12, 2018

Related U.S. Application Data

(60) Provisional application No. 62/444,773, filed on Jan. 10, 2017.

(51) Int. Cl.
| | |
|---|---|
| *H01S 5/40* | (2006.01) |
| *H01S 5/022* | (2006.01) |
| *H01S 5/024* | (2006.01) |
| *G02B 19/00* | (2006.01) |
| *G02B 6/42* | (2006.01) |

(52) U.S. Cl.
CPC ........ *H01S 5/4025* (2013.01); *G02B 19/0057* (2013.01); *H01S 5/02284* (2013.01); *H01S 5/02292* (2013.01); *H01S 5/02469* (2013.01); *H01S 5/405* (2013.01); *H01S 5/4012* (2013.01); *G02B 6/425* (2013.01); *G02B 6/4296* (2013.01)

(58) Field of Classification Search
None
See application file for complete search history.

(56) References Cited

U.S. PATENT DOCUMENTS

| | | | |
|---|---|---|---|
| 8,891,579 B1 | 11/2014 | Price et al. | |
| 9,214,786 B2* | 12/2015 | Hemenway | ........... H01S 5/2036 |
| 9,343,868 B2 | 5/2016 | Sipes, Jr. et al. | |
| 9,455,552 B1 | 9/2016 | Price et al. | |
| 2006/0126690 A1* | 6/2006 | Kido | ...................... G02B 6/425 |
| | | | 372/43.01 |
| 2010/0226405 A1* | 9/2010 | Chuyanov | ............ G02B 27/143 |
| | | | 372/50.12 |
| 2014/0064305 A1* | 3/2014 | Sipes, Jr. | ........... G02B 19/0057 |
| | | | 372/6 |
| 2014/0211466 A1 | 7/2014 | Dewa et al. | |

(Continued)

OTHER PUBLICATIONS

International Search Report and Written Opinion from International Application No. PCT/US2018/013201, dated Jun. 27, 2018, 10 pages.

(Continued)

*Primary Examiner* — Tod T Van Roy
(74) *Attorney, Agent, or Firm* — Klarquist Sparkman, LLP

(57) ABSTRACT

A number of beams that can be coupled into an optical fiber can be increased using emitted beams having greater divergence, thus providing increased beam power. Alternatively, with a fixed number of emitters, total optical power can be maintained with fewer beams in an output beam with a smaller numerical aperture.

16 Claims, 7 Drawing Sheets

(56) References Cited

U.S. PATENT DOCUMENTS

2016/0006216 A1 1/2016 Kanskar
2016/0181762 A1 6/2016 Dawson et al.

OTHER PUBLICATIONS

International Preliminary Report on Patentability from International Application No. PCT/US2018/013201, dated Jul. 25, 2019, 8 pages.
First Office Action from related Chinese Application No. 201880011359.5, dated Sep. 24, 2020, 20 pages (with English translation).

* cited by examiner

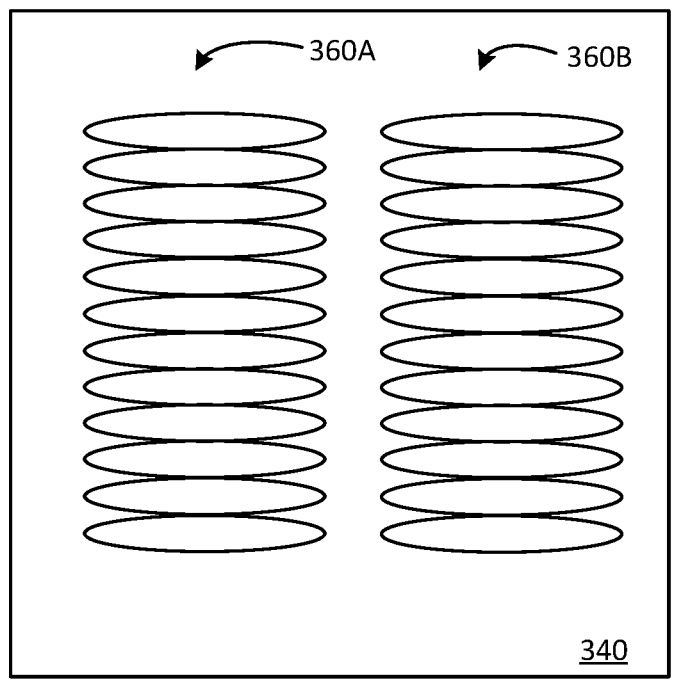
FIG. 3E
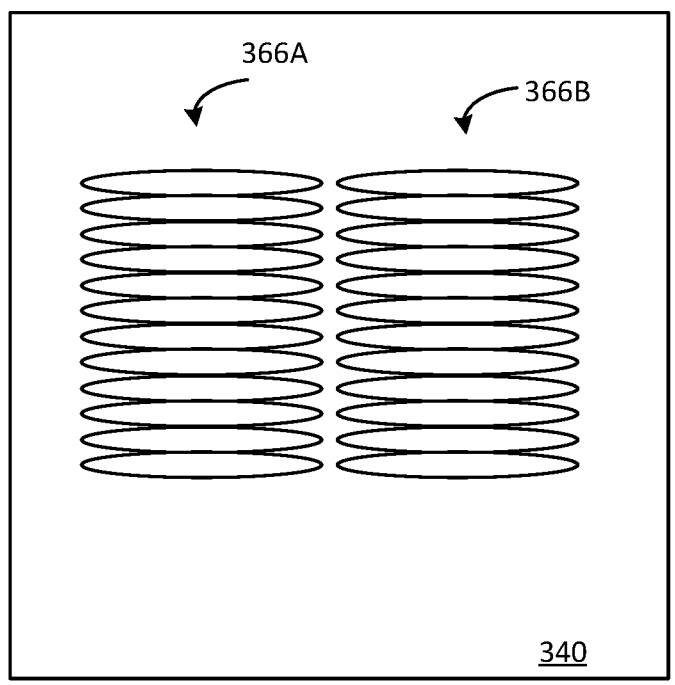
FIG. 3F
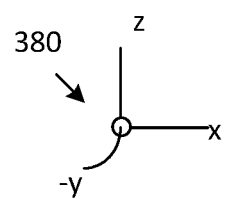

FIG. 5A
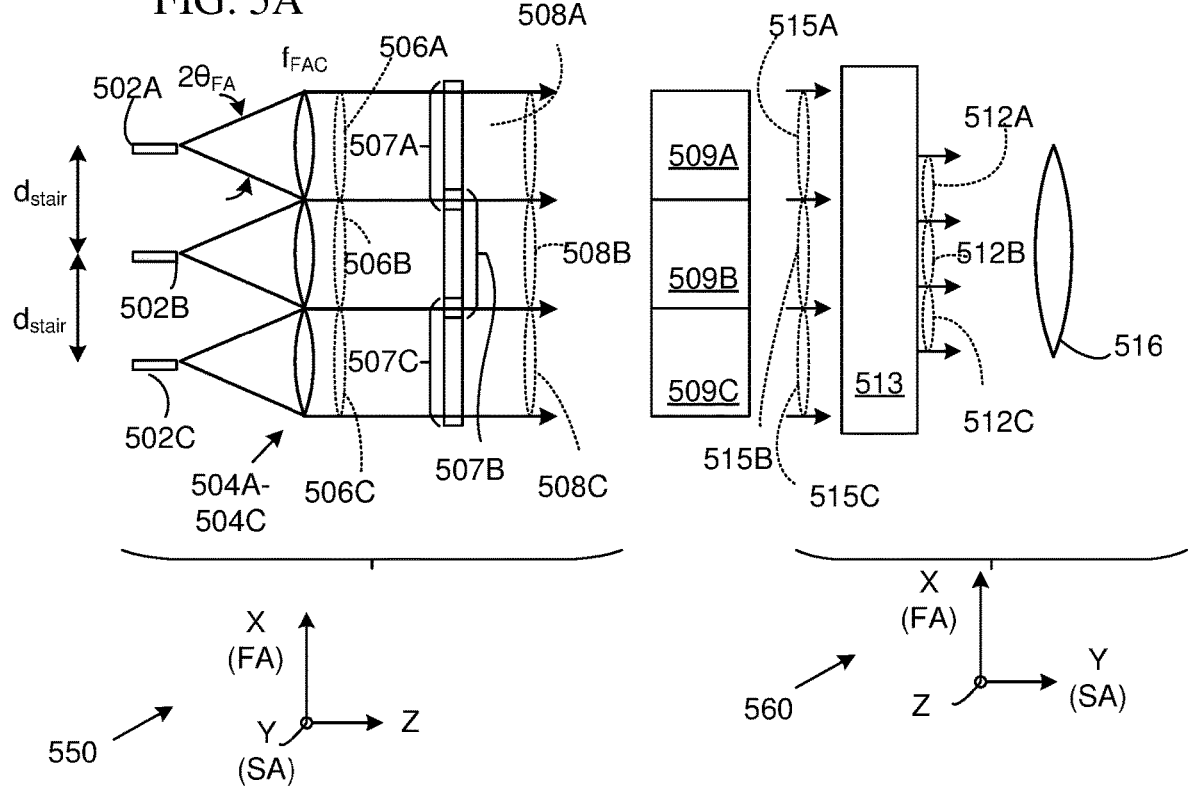
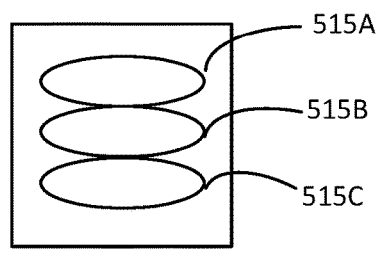
FIG. 5B
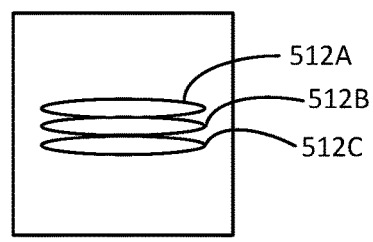
FIG. 5C

POWER AND BRIGHTNESS SCALING IN FIBER COUPLED DIODE LASERS USING DIODES WITH OPTIMIZED BEAM DIMENSIONS

CROSS REFERENCE TO RELATED APPLICATION

This application claims the benefit of U.S. Provisional Application No. 62/444,773, filed Jan. 10, 2017, which is hereby incorporated by reference in its entirety.

FIELD

The disclosure pertains to multi-emitter laser diode systems.

BACKGROUND

There is great demand for fiber-coupled high-power, high-brightness diode lasers for applications such as fiber laser pumping and materials processing. In some approaches such as described in U.S. Pat. Nos. 8,891,579, 9,455,552, and U.S. Publication 2016/0181762, which are incorporated herein by reference, multiple single-emitter diode lasers are stacked along the fast axis to achieve power scaling and brightness improvement. One way to further scale package power is to add more emitters in the fast axis direction. However, adding emitters increases fast axis numerical aperture (NA) so that power in the same NA does not increase further. It is therefore desired to be able to increase the number of emitters stacked in the fast axis for power scaling, and keep the fast axis image size and NA unchanged at the fiber aperture, or equivalently, maintain a fast axis beam-parameter-product, BPP, so that brightness improvement is achieved.

SUMMARY

The disclosure generally pertains to methods and apparatus that enable a number of beams that can be coupled into an optical fiber to be increased using emitted beams having a greater divergence, thus providing increased coupled beam power. Alternatively, with a fixed number of emitters, total optical power can be maintained with fewer beams in an output beam having a smaller numerical aperture.

In some examples, apparatus comprise a set of laser diodes with a predetermined spacing with respect to a stacking axis, each laser diode having an emission region defining a fast axis and a slow axis that produces an emitted beam having a beam fast axis full width of less than 1.62 µm. Fast axes of each of the laser diodes are mutually parallel and orthogonal to the stacking axis, and slow axes of each of the laser diodes are mutually parallel and orthogonal to the stacking axis. Fast axis collimators (FACs) are associated with each of the laser diodes, each of the fast axis collimators having a common focal length. Emission regions of each of the laser diodes are coupled to a respective fast axis collimator so as to produce respective beams that are collimated along the fast axes. An afocal telescope (also referred to as a fast axis telescope or FAT) is situated to receive the fast axis collimated beams from the fast axis collimators and produce a fast axis beam spacing based on the predetermined spacing and a magnification M associated with the afocal telescope. An objective lens receives the fast axis collimated beams from the afocal telescope and delivers a combined beam to a core of an optical fiber. Typically, the FACs and the objective lens have focal lengths $f_{FAC}$ and $f_O$, respectively, M is a magnification of the FAT in the fast axis direction, and a magnification of the emission regions of the laser diodes at the fiber is $f_O/Mf_{FA}$. In typical examples, M is less than 0.8, $f_{FAC}$ is between 100 µm and 1,000 µm, 250 µm to 600 µm, 200 µm and 400 µm, and $f_O$ is between 5 mm and 12 mm. In a particular example, the set of laser diodes consists of two sets of seven laser diodes that couple an optical power of at least 160 W into the optical fiber. The optical fiber has a core diameter of 50 µm, 105 µm, or 200 µm and the fast axis spacing is between 400 µm and 450 µm. In typical embodiments, the laser diodes are distributed along a slow axis direction so as to have a fixed spacing. In still further examples, a set of reflectors corresponding to each of the laser diodes of the set of laser diodes includes respective reflectors situated to receive a beam from a respective FAC and direct the beam to the objective lens so that propagation axes of the directed beams at the objective lens are parallel. Typically, a set of slow axis collimators (SACs) is situated to receive respective beams from the FACs and direct the FA and SA collimated beams to respective reflectors.

Optical beam sources comprise a set of laser diodes situated to have a fixed spacing along respective fast axes that are mutually parallel, each laser diode defined by fast axis beam with full width of less than 1.6 µm and having an emission region defining a fast axis and a slow axis, wherein fast axes of each of the laser diodes are mutually parallel and slow axes of each of the laser diodes are mutually parallel and orthogonal to the fast axes. Fast axis collimators (FACs) and slow axis collimators (SACs) corresponding to each of the laser diodes of the set are situated to collimate optical beams emitted from respective emission regions of each of the laser diodes. Each of the FACs can have a common focal length $f_{FAC}$ and each of the SACs can have a common focal length $f_{SAC}$. An afocal telescope is situated to receive the collimated beams and produce a fast axis beam spacing based on the predetermined spacing and a magnification M associated with the afocal telescope. An objective lens is situated to receive the beams from the afocal telescope and direct the beams to a focus. An optical fiber having an input surface is situated at the focus of the objective lens. In particular examples, the optical fiber has a core diameter of between 50 µm and 1.0 mm. In other examples, each of the laser diodes is secured to a respective step of a laser diode mount having a plurality of steps so as to be uniformly spaced apart along respective fast axes.

Methods include selecting at least one of an emitted beam fast axis divergence, an emitted beam fast axis size, a fast axis waveguide thickness so as to couple emitted beams from a selected number of laser diodes into an optical fiber based on a predetermined step height of a laser diode mount. The selected number of laser diodes is situated at the predetermined height and slow axis and fast axis collimation lenses are situated so as to produce collimated beams from emitted beams from each of the laser diodes. A fast axis telescope and an objective lens are situated so as to direct the collimated beams into the optical fiber. In some examples, at least one of the emitted beam fast axis divergence, the emitted beam fast axis size, and the fast axis waveguide thickness is selected based on a numerical aperture of the optical fiber. In typical examples, the step height is between 400 µm and 500 µm, and a magnification of the fast axis telescope is less than one. In some embodiments, a fast axis magnification of the emitted beam is selected based on a core diameter of the optical fiber.

In other examples, methods comprise selecting at least one of an emitted beam fast axis divergence, an emitted beam fast axis size, or a fast axis waveguide thickness so as to couple a combined beam having a selected power, a selected numerical aperture, or both into an optical fiber based on fixed separations along fast axis directions and a number of laser diodes. The laser diodes are situated at the fixed separations and emitted beams from each of the laser diodes are directed to the optical fiber with corresponding fast and slow axis collimators, a fast axis telescope, and an objective lens. In typical examples, the emitted beam fast axis size is less than 1.60 μm.

The foregoing and other objects, features, and advantages of the disclosed technology will become more apparent from the following detailed description, which proceeds with reference to the accompanying figures.

BRIEF DESCRIPTION OF THE DRAWINGS

FIGS. 3E-3F illustrate a beam stack without interbeam gaps before and after compression

FIGS. 5A-5C illustrate a multi-emitter arrangement in which beams from three laser diodes are combined so as to fill an objective lens aperture.

DETAILED DESCRIPTION

Figure 1:
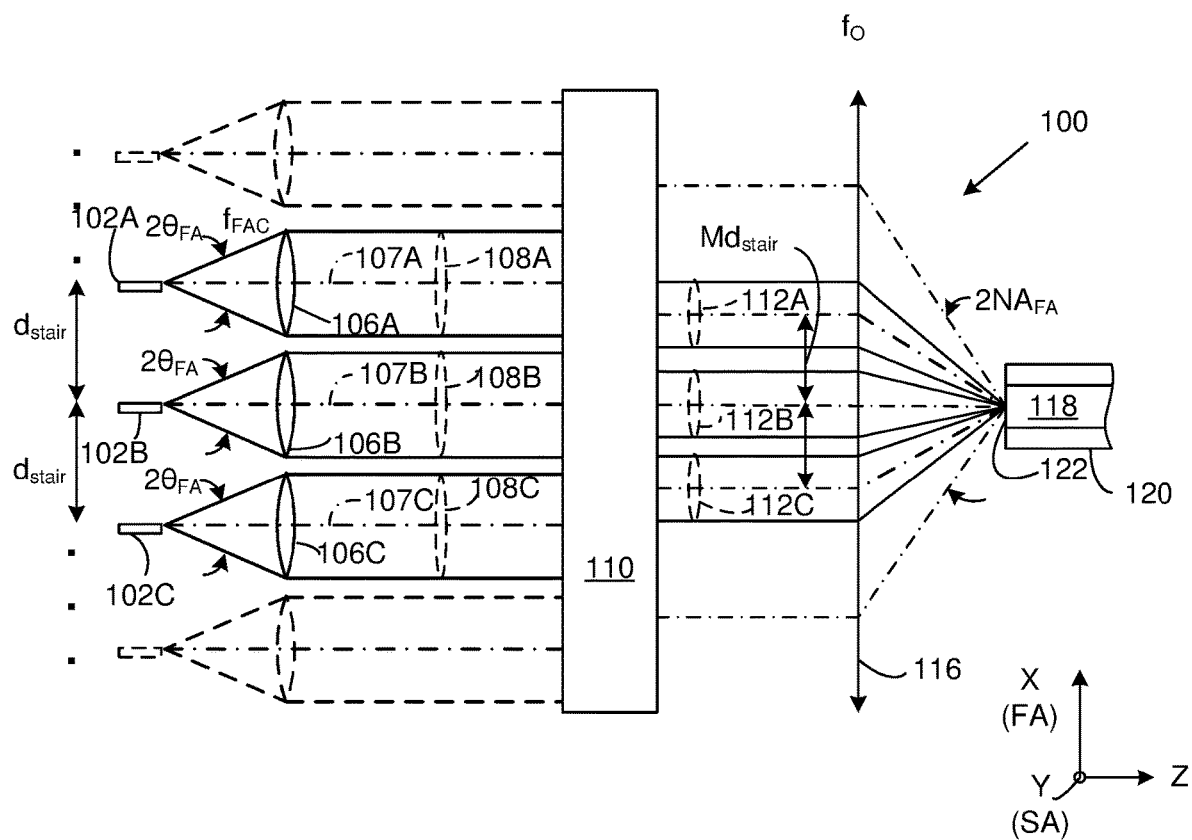
FIG. 1 illustrates a multi-emitter assembly that couples beams from multiple emitters into an optical fiber.

Conventional multi-emitter laser diode systems generally attempt to achieve large output powers by combining beams from multiple emitters. For high power operation, relatively thick semiconductor gain regions are used to reduce power density to permit long term, damage-free emitter operation. Beam combining can be limited by the relatively large emitter fast axis numerical apertures, and increases in gain region thickness to provide increased power and damage resistance produce a reduced fast axis numerical aperture, simplifying beam combining optics. This disclosure adopts an approach that recognizes that, in contrast to conventional approaches, thinner gain regions and higher fast axis numerical apertures permit coupling of power from more emitters into a beam delivery fiber, and thus offer higher beam powers. Thus, disregarding conventional approaches permits superior multi-emitter laser diode systems as discussed below.

As used in this application and in the claims, the singular forms "a," "an," and "the" include the plural forms unless the context clearly dictates otherwise. Additionally, the term "includes" means "comprises."

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

In the following description, laser beams or other propagating optical radiation is referred as propagating along one or more axes. As used herein, such an axis refers to a linear axis that can bent or folded using optical elements such as prisms or mirrors. In some examples, optical elements such as cylindrical lenses or spherical lenses are referred to as centered or on-axis so as to indicate lenses having a central axis that is directed through surface centers of curvature. In other examples, off-axis lenses or lens segments can be used. Lens center thickness refers to a lens thickness taken along a principal axis that extends through surface centers of curvature. In the disclosed examples, surface curvatures generally correspond to cylindrical or spherical surfaces, but more complex curvatures can be used. Even for such more complex surfaces such as aspheric surfaces, a surface radius of curvature is generally defined based on an on-axis curvature although off-axis surface shape does not follow this curvature. Optical surfaces can be provided with anti-reflection or other coatings, but are such coatings are omitted from the disclosed examples. Beams, surfaces and axes are generally referred to as parallel if within about 1 degree, 2 degrees, or 5 degrees.

Disclosed herein are systems, methods, and apparatus that can permit laser package brightness scaling based on selection of suitable fast axis dimensions of single-emitter laser diode emission regions, typically by selecting epitaxial waveguide designs with selected waveguide thicknesses, refractive indices, and refractive index differences. Laser diodes generally are defined by one or more epitaxial layers so that an emission region is thin but elongated. An axis parallel to an epitaxial layer thickness dimension is referred to herein as a fast axis (FA), as an emitted beam has a greater divergence in this direction. Typically, emission in the FA direction is diffraction limited, and emitted beam numerical aperture is proportional a ratio of beam wavelength and emission region thickness. An axis parallel to the epitaxial layers is referred to herein as a slow axis (SA), as an emitted beam has a lesser divergence in this direction than along the fast axis. In most examples, along a slow axis, an emitted beam does not correspond to a single mode, and can have a complex intensity distribution while along the fast axis, beam intensity is approximately Gaussian. For convenience, beam divergences and dimensions with respect to the fast axis and the slow axis are referred to as fast/slow axis numerical apertures or fast/slow axis angular radii or diameters. Beam dimensions are similarly referred to as fast/slow axis beam diameters, radii, or widths. Beam dimensions can be based on $1/e^2$ intensities or amplitudes, or other values and can be full widths or half-widths. In the drawings and description below, beam manipulation in the slow axis direction may be not be discussed in order to emphasize fast axis characteristics.

In some examples, emitted beams are characterized based on dimensions corresponding to $1/e^2$ intensities or amplitudes. Emitted beams can also be described with reference to effective emission areas and dimensions, or angular dimensions that correspond to a ratio of emission wavelength to beam dimensions or emission area dimensions. In typical examples, laser diodes with fast axis divergences of >50° (FW at $1/e^2$ power) are stacked in diode laser arrays. For a fixed fast axis collimator (FAC) focal length and stair height, larger fast axis divergence permits higher fill factor/less dead space in the combined collimated beams produced by the FACs, slow axis collimators (SACs), and fast axis telescopes (FATs). Beam divergence is generally a function of beam wavelength, dimensions of beam emission areas, and waveguide refractive index. A particular divergence angle can be selected based on beam wavelength and emission region characteristics. In most examples, laser diodes that emit at wavelengths between 800 nm and 1,000 nm are used, but laser diodes at any available wavelength range between 200 nm and 2,000 nm or any other range can be used.

FIG. 1 depicts portions of a representative multi-emitter system. For convenient illustration, three emitters and the associated optical elements are shown in detail, but additional emitters and the associated optical elements are generally included and are represented with dashed lines in FIG. 1. As shown in FIG. 1, laser diodes 102A-102C are spaced apart by a common distance $d_{stair}$ along a fast axis direction (shown as an X-direction in FIG. 1) and emit beams having fast axis angular radii $\theta_{FA}$. The laser diodes 102A-102C are typically offset in a Y-direction (perpendicular to the plane of FIG. 1), but such displacements are not shown in FIG. 1. Respective fast axis collimators (FACs) 106A-106C receive beams from the laser diodes 102A-102C and produce collimated beams 108A-108C directed along axes 107A-107C. An afocal telescope (also referred to as a beam expander or fast axis telescope (FAT)) 110 receives the beams and produces compressed output beams 112A-112C. An objective lens 116 then focuses or otherwise directs the output beams 112A-112C into a core 118 of an optical fiber 120. A combined beam formed by the focused beams corresponding to compressed output beams 112A-112C is directed to the core 118 with a numerical aperture (NA) that is proportional to $mMd_{stair}/2f_O$, wherein M is a FAT magnification, m is a total number of emitters, and $f_O$ is a focal length of the objective lens 116. In typical practical examples, the magnification M<1 and is applied only along the fast axis with an afocal telescope based on cylindrical lenses. A fast axis angular radius of each of the focused, compressed beams is approximately $Mf_{FAC}\theta_{FA}/f_O$ and a fast axis magnification of the emission region of each of the laser diodes 102A-102C is about $f_O/Mf_{FAC}$ so that a product of angular radius and fast axis beam height remains constant. The objective lens 116 is generally situated to focus the compressed beams 112A-112C at a surface 122 of the fiber 120. As shown in FIG. 1, the laser diodes 102A-102C produce beams with a common divergence, and the FACs 106A-106C have a common focal length. Fast axis magnification of the emission region of each of the laser diodes 102A-102C is about $f_O/Mf_{FAC}$: slow axis beam size is generally unchanged by a FAT.

In the example of FIG. 1, emitted beams from the laser diodes 102A-102C are shown as filling the lens apertures, and in cases in which FA lens apertures are not filled, additional emitters and associated optics can be situated to fill any gaps to increase coupled optical power. In most cases, beams are arranged to slightly underfill FACs to avoid clipping.

In a multi-emitter system such as shown in FIG. 1, a fast axis image spot size at the input surface of the output fiber can be expressed as:

$$D_{FA} = B_{FA} \times \frac{f_O}{f_{FAC} \times M}$$

wherein $B_{FA}$ is the emitted diode beam size in the fast axis direction, $f_O$ and $f_{FAC}$ are focal lengths of the objective lens and the FACs, respectively, and M is the magnification of a fast axis telescope (FAT). The fast axis $NA_{FA}$ is, to first order, independent of the diode fast axis beam size or the FAC lens focal length:

$$NA_{FA} = \frac{d_{stair} \times m \times M}{2 \times f_O}$$

wherein $d_{stair}$ is the diode laser stair (stacking) height and m is the number of diode lasers stacked in the fast axis direction. The fast axis beam parameter product ($BPP_{FA}$) is then:

$$BPP_{FA} = \frac{D_{FA}}{2} \times NA_{FA} = \frac{B_{FA} \times d_{stair} \times m}{4 \times f_{FAC}}.$$

To increase fiber-coupled brightness in the fast axis, a number of stacked diode lasers can be increased, hence increasing the power, while keeping fast axis BPP constant and below a maximum allowable fiber BPP.

Stair height can be decreased to $d_{stair2}$ such that $d_{stair2}=d_{stair1} \times m_1/m_2$ wherein $m_1$ and $m_2$ are numbers of stacked emitters associated with $d_{stair1}$, $d_{stair2}$, respectively. Unfortunately, this approach requires changes to a substrate that provides the fast axis spacing $d_{stair}$. Such substrates can be difficult or expensive to manufacture, and it is often desirable to use the same or similar substrates with a common fast axis spacing $d_{stair}$ for multi-emitter systems with various numbers of emitters. Emitter fast axis spacings $d_{stair}$ are typically between about 250 μm and 1.0 mm, or between about 400 μm and 500 μm, and are practically manufactured to tolerances of ±10 μm, ±20 μm, ±50 μm, and, in some cases, are made of expensive materials or materials that are difficult to process. In some examples, fixed spacings of 100 μm, 200 μm, 250 μm, 300 μm, 350 μm, 400 μmm, 450 μm, 500 μm, 550 μm, 600 μm, 750 μm, 800

μm, 900 μm, or 1000 μm or other spacings ranging from about 75 μm to about 5 mm are used for various numbers of emitters. Thus, approaches for increasing emitter stacking along the fast axis that do not require changes in fast axis spacing are preferred. Alternatively, the FAC focal length can be increased and then FAT magnification reduced that $f_{FAC2}=f_{FAC1} \times m_2/m_1$ and $M_2=M_1 \times m_1/m_2$. This requires special FAC designs that can be complex, and, in any case, can require different mounting and assembly materials and procedures. Thus, approaches that do not require change to the FACs are preferred, especially for manufacturing systems with different numbers of emitters using common optical and mechanical components.

For convenient manufacturability and scalability, the fast axis beam size and the FAT magnification can be reduced so that $B_{FA2}=B_{FA1} \times m_1/m_2$ and $M_2=M_1 \times m_1/m_2$. Compared to other approaches mentioned above, this requires little to no change to the optical design architecture or optical alignment and fabrication processes; fast axis beam size can be controlled via emitter epitaxial layer design. Reducing the fast axis beam dimension of the diode lasers allows reducing the fast axis BPP for low beam NA, or allows increasing the emitter count with the same BPP for high power/brightness. A product of a single emitter fast axis BPP and a number of diode lasers stacked in the fast axis is typically less than a maximum fast axis BPP allowed by the fiber, i.e. $m \times BPP_{SE} < BPP_{FA}$, wherein m is number of stacked emitters, $BPP_{SE}$ is a single emitter BPP, and $BPP_{FA}$ is a fiber BPP. More single emitters can be stacked and coupled into the fiber, at the expense of beam clipping that may result in power loss and reduced reliability.

Some representative examples are summarized in the following table which also includes parameters for a conventional multi-emitter system that is based on a larger initial fast axis beam size. The systems in the table are based on combining two sets of fast axis stacked emitters using polarization, wavelength, or other multiplexing method, and total numbers of emitters are expressed as 2×7 or 2×8. The table also includes slow axis (SA) beam sizes, wherein the same SA properties are used in the representative examples. FA image sizes can be determined as $B_{FA}f_O/(f_{FAC} M)$. In these examples, emission wavelengths are about 0.9 μm, but similar systems at other wavelengths can be provided. Typical wavelengths range from about 250 nm to about 2.0 μm.

TABLE 1

Representative Multi-Emitter Laser Diode Systems

|  | Conventional FA Beam Size System | Thin FA Beam Size Low NA System | Thin FA Beam Size High Power System |
|---|---|---|---|
| Configuration | 2 × 7 element | 2 × 7 element | 2 × 9 element |
| Output Fiber Diameter | 105 μm | 105 μm | 105 μm |
| Emitted Fast Axis Beam Size (FW at $1/e^2$) | 1.7 μm | 1.34 μm | 1.34 μm |
| Emitted Fast Axis Beam Divergence (FW at $1/e^2$) | 44° | 57° | 57° |
| Emitted Slow Axis Beam Size (FW at $1/e^2$) | 95 μm | 95 μm | 95 μm |
| FAT magnification (M) | 0.9x | 0.7x | 0.7x |
| Fiber Coupled Power | 160 W | 160 W | 205 W |
| FA Image Size at Fiber | 65 μm | 66 μm | 66 μm |
| FA NA at Fiber | 0.138 | 0.107 | 0.138 |
| NA (95% Power Enclosure) | 0.150 | 0.132 | 0.150 |

As is apparent from Table 1, thin (or high NA) emitters can be used to increase fiber coupled power by combining power from additional emitters, even with a fixed spacing of the laser diodes along the fast axis, or, without increasing the number of emitters, to reduce beam NA at the output fiber while providing the same power. Emitted fast axis beam sizes (FW at $1/e^2$) of less than 1.60 μm, 1.58 μm, 1.56 μm, 1.54 μm, 1.52 μm, 1.50 μm, 1.48 μm, 1.46 μm, 1.44 μm, 1.42 μm, 1.40 μm, 1.38 μm, 1.36 μm, 1.34 μm, 1.32 μm, 1.30 μm, 1.28 μm or smaller can be used, or any size between about 1.70 μm and 1.20 μm, or emitted beams having divergences corresponding to such beam sizes. Typical emitted beam full width divergences (1/e2 beam power) are 36, 38, 40, 42, 44, 46, 48, 49, 50, 51, 52, 53, 54, 55, 56, 57, 59 degrees or more. Typical FAT magnifications are 0.9, 0.85, 0.8, 0.75, 0.7, 0.6, 0.55, 0.5, 0.45, 0.4, 0.35, 0.30 or less, or any value between 0.25 and 1.0. In one example, a magnification of 0.34 is used.

The above methodology of brightness scaling through reduced fast axis beam size does not require specific slow axis dimensions and can be applied in fiber-coupled diode laser packages using laser diodes with a variety of slow axis widths. According to conventional understanding, the likelihood of catastrophic optical mirror damage (COMD) would increase at a given power per emitter in systems such as described above. A maximum CW diode power limited by facet COMD can be expressed as:

$$P_{max} = \frac{d_{QW}}{\Gamma} \times W \times \frac{1-R}{1+R} \overline{P}_{COMD}$$

wherein $d_{QW}$ is active layer thickness, $\Gamma$ is a fast axis modal confinement factor, $d_{QW}/\Gamma$ is effective fast axis modal size, W is a slow axis beam width, R is a PR facet (output coupler) reflectivity, and $\overline{P}_{COMD}$ is a COMD power density. Reducing fast axis beam size alone will reduce the maximum diode power, or, increasing the likelihood of COMD operating at the same power level. In some examples, increasing slow axis beam width can compensate the reduction of fast axis beam size for comparable facet reliability. To achieve high facet reliability without sacrificing slow axis brightness, laser diode designs having wider slow axis beam widths but with the same or even lower slow axis BPP are preferred. For example, a specific SA beam size can be selected in so-called flared laser diodes as described in U.S. Pat. No. 9,166,369, which is incorporated herein by reference. Flared laser diodes permit selection among various slow-axis widths that all provide the same SA BPP and can satisfy facet reliability requirements as fast axis beam size is reduced.

The examples of Table 1 are examples only, and are not to be taken as limiting. For clarity, size and NA at the output fiber are calculated using geometrical optics models and all are at a wavelength of about 0.9 µm.

The low NA high brightness 2×7 emitter example (column two) uses laser diodes with reduced FA beam size of 1.34 µm, instead of a conventional FA beam size of 1.7 µm. This results in a reduced fast axis BPP under the same diode laser count of 2×7. The FAT magnification is modified to obtain the same fast axis image size at the fiber (for the same efficient fiber coupling). The fast axis NA, on the other hand, is reduced to 0.107 from 0.138 because of the reduced fast axis BPP. The 95% NA is 0.132 as opposed to 0.150. While the fiber-coupled power is maintained at a similar level because of the same emitter count, the brightness is significantly improved. In some examples, both FAT magnification and objective lens focal length are varied.

The high brightness 2×9 emitter uses the same reduced FA beam size laser diodes, as well as the same optics, as in the low NA package. Instead of aiming at reduced fast axis BPP, two more rows of emitters have been stacked in the vertical direction for power scaling while maintaining the same fast axis BPP as in the conventional package (column one). The result is a 28% fiber-coupled power increase.

Table 2 lists the fast axis modal confinement factor, and slow axis beam width for a couple of diode laser designs: a 95-µm rectangular design with a 1.7 µm fast axis beam size and a flared laser diode with 1.34 µm fast axis beam size. The flared laser diode has a 125 µm slow axis beam width but similar or smaller BPP than that of the 95-µm rectangular laser. The maximum CW COMD power of the flared laser diode, proportional to $W \times d_{QW}/\Gamma$, is 7% higher than the rectangular design, even though it has a fast axis beam size that is 21% smaller. Therefore, there should be no facet reliability concerns on flared laser diodes with reduced fast axis beam size.

TABLE 2

Beam parameters related to the maximum COMD power for non-flared and flared laser diodes with 1.7 µm and 1.34 µm fast axis beam sizes, respectively.

|  | FA Beam Size | Confinement Factor Γ | SA Beam Width | Maximum CW diode power (arbitrary units) |
| --- | --- | --- | --- | --- |
| rectangular laser | 1.7 µm | 0.48% | 95 µm | 1 |
| flared laser | 1.34 µm | 0.59% | 125 µm | 1.07 |

Figure 2A:
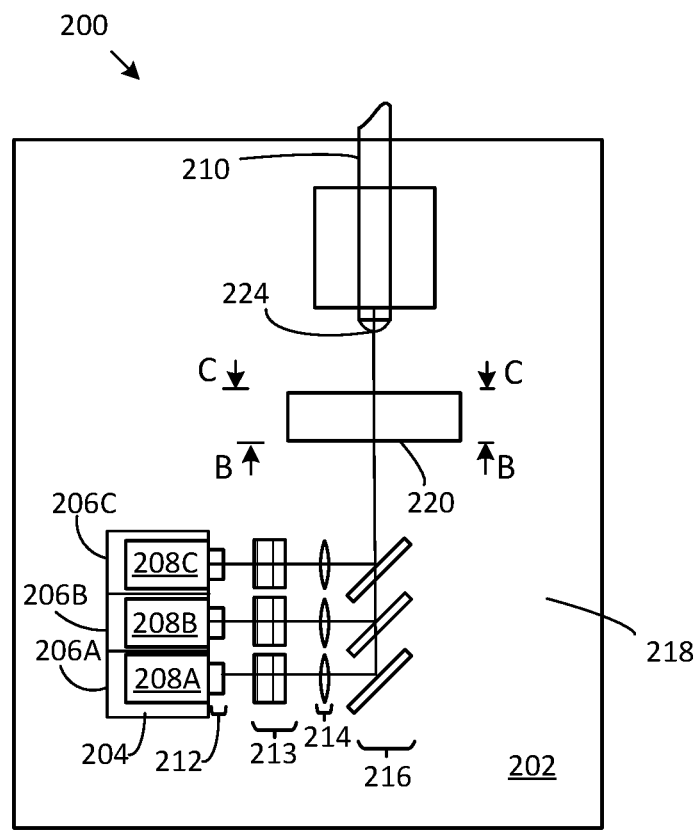
FIG. 2A illustrates a representative laser diode assembly in which a stack of three laser beams is compressed with a beam compressor.
Figure 2B:
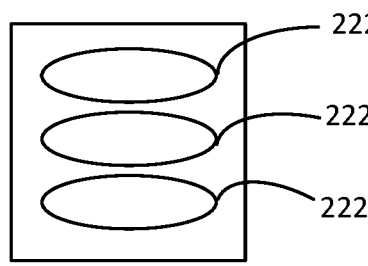
FIG. 2B illustrates an input beam stack.
Figure 2C:
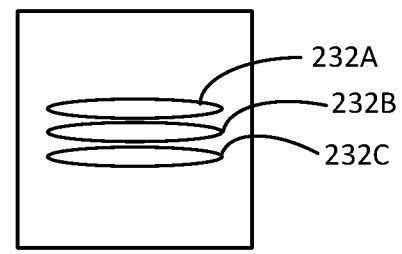
FIG. 2C illustrates a compressed beam stack.

Another example using thinned waveguides is shown in FIGS. 2A-2C. A packaged diode laser assembly 200 includes a housing 202 that is shown partially removed for convenient illustration. A stepped surface 204 includes a plurality of stepped surface portions 206A-206C to which one or more diode lasers 208A-208C, respectively, are secured so as to be situated at different heights, typically so as to monotonically descend or ascend. Typically, a single diode laser is secured to each step and the diode lasers are secured to the steps so as to emit laser radiation along substantially parallel axes. Deviations from a parallel arrangement can be compensated as needed as will be discussed below. In FIG. 2A, fast axes of the laser diodes 208A-208C are perpendicular to the plane of the figure; slow axes are in the plane of the figure. The emitted beams from the laser diodes 208A-208C are received and collimated by fast axis collimation optics 212 and slow axis collimation optics 214 to produce collimated beams. Optional volume Bragg grating elements 213 can be positioned between the fast axis collimation optics 212 and the slow axis collimation optics 214 to provide locking of the wavelength of the lasers diodes 208A-208C. Turning mirrors 216 receive the collimated beams which propagate generally parallel to each other after collimation. In the example of FIG. 2A, the turning mirrors 216 are situated to reflect the collimated beams at right angles so that the reflected beams are directed to a beam compressor 220 (i.e., a fast axis telescope). Propagation directions of each laser diode can be adjusted with a corresponding adjustment of the corresponding reflector. At the beam compressor 220, fast axes of the reflected beams are stacked one above another to form stacked beams 222A-222C (shown in FIG. 2B) corresponding to diode lasers 208A-208C, respectively, and having separations based on the heights of the stepped surface portions 206A-206C. The turning mirrors 216 and the slow axis collimation optics 214 can be conveniently secured to a common surface 218.

A top-most portion of each turning mirror 216 for each collimated beam is situated at a height so that the reflected beams are not clipped by subsequent turning mirrors 216. For example, in FIG. 2A, a bottom-most mirror in the drawing has the largest height to correspond with a largest step height of the corresponding stepped surface portion 206A. A spacing of the stacked beams 222A-222C is adjusted with the beam compressor 220 and then the compressed beams are directed to an objective lens 224 that directs the compressed beam into an optical fiber 210. In some examples, the objective lens 224 is a single planoconvex lens, while in other examples more complex multi-element lenses are used, including spherical and aspherical surfaces.

As shown in FIG. 2B-2C, an input beam stack of stacked beams 222A-222C is output by the beam compressor 220 as a compressed beam stack of beams 232A-232C. Note that beam separation is compressed, along with beam diameter in the direction of compression. In this example, gaps between the stacked beams 222A-222 are compressed as well.

Figure 3A:
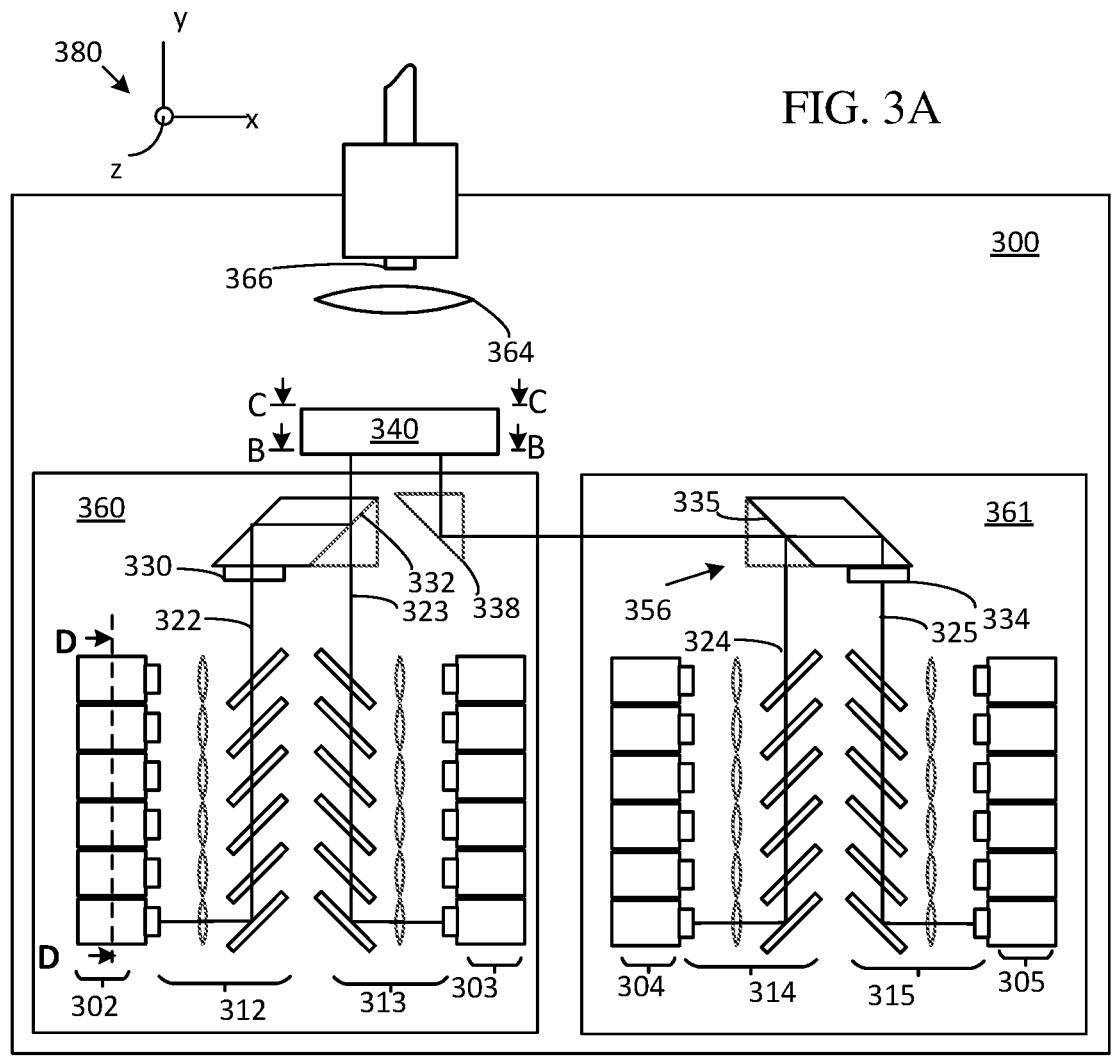
FIG. 3A illustrates a laser diode assembly in which two beam stacks are formed using polarization multiplexing, and the two beam stacks compressed using a beam compressor.
Figure 3D:
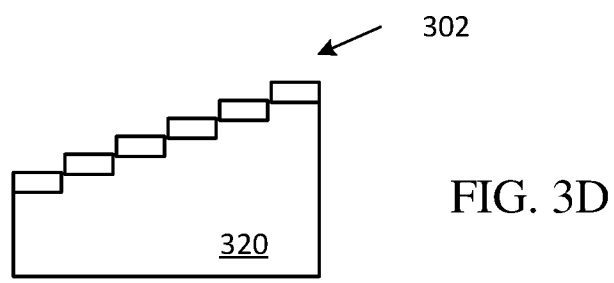
FIG. 3D illustrates a representative stair-step laser diode mount.

With reference to FIGS. 3A-3D, a diode laser assembly 300 is described with reference to a right-handed xyz coordinate system 380 in which a z-axis extends upwardly out of the plane of FIG. 3A. The diode laser assembly 300 includes sets of laser diodes 302-305 that are arranged to emit respective sets of laser beams to corresponding sets of reflectors and fast and slow axis collimators 312-315. For example, the laser diodes of the set 302 emit beams along an x-axis direction that are then redirected by respective reflectors of the set 312 so as to propagate along a y-axis direction. The laser diodes of each set are displaced or offset from other laser diodes of the same set along a z-axis and the associated reflectors situated so that laser beams from the set are not blocked by the reflectors. As shown in FIG. 3D, the set of laser diodes 302 is secured to a stepped mount 320 to provide suitable z-axis offsets; similar mounts are provided for the remaining sets of laser diodes. In most cases, the stepped mount 320 is made of a thermally conductive material. For convenience, beam propagation axes 322-325 are shown for the bottom-most laser diodes of each set; beam propagation axes for the remaining laser diodes of each set are similar, but displaced along the z-axis.

The laser beams from the set of laser diodes 302 are directed to a half-wave retarder 330 and then combined with the laser beams from the set of laser diodes 303 at a polarizing beam splitter 332 so that a vertically stacked set of beams 336A (shown in FIG. 3B) is incident to a beam compressor 340. The laser beams from the set of laser diodes 305 are directed by reflectors of the set 315 to a half-wave retarder 334 and then combined with the laser beams from the set of laser diodes 304 as redirected by reflectors of the set 314 at a polarizing beam splitter 335 so that a vertically stacked set of beams 336A is incident to the beam compressor 340.

Figure 3B:
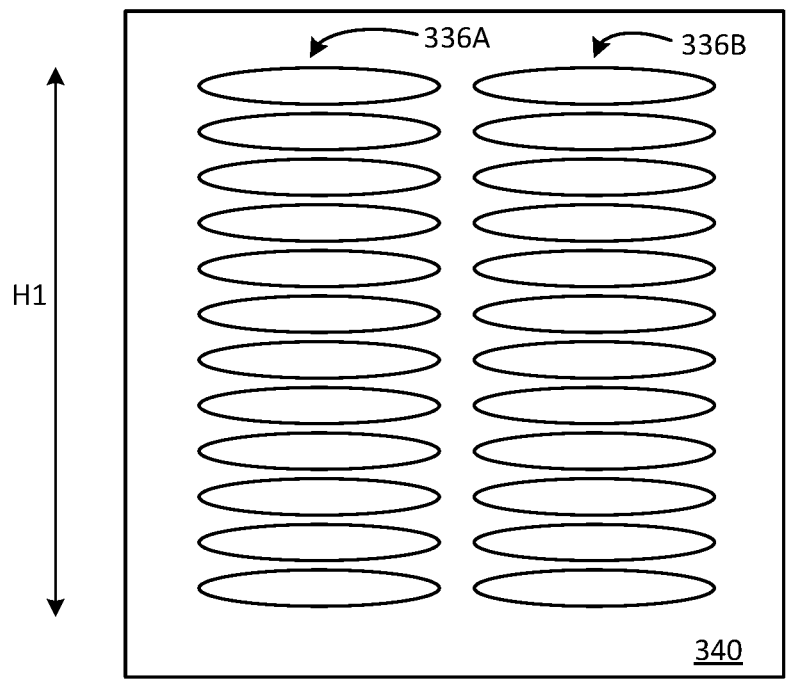
FIGS. 3B-3C illustrate a beam stack before and after compression.
Figure 3C:
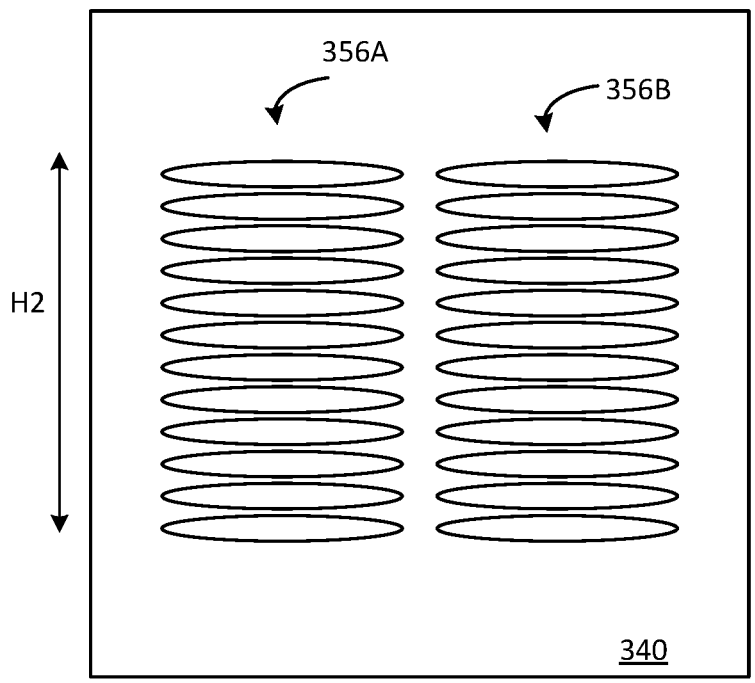

FIG. 3B illustrates the stacked beams 336A, 336B as incident to the beam compressor 340; FIG. 3C illustrates stacked beams 356A, 356B exiting the beam compressor 340, wherein both beam spacing and individual beam height are altered by a compression ratio M=H2/H1. In this example, a cylindrical beam compressor is used and there is compression in a z-direction but not in an x-direction. Additional compressors can be provided for compression in other directions, or a compressor using spherical surfaces can be used. In some examples, beams are arranged without gaps along the fast axis direction. FIG. 3E illustrates stacked beams 360A, 360B exiting the beam compressor 340 without gaps between beams and FIG. 3F illustrates stacked beams 366A, 366B exiting the beam compressor 340 without gaps between beams. Additional space that is available by situating beams without gaps can be provided with beams from additional emitters to provide higher output powers or otherwise take advantage of multiple emitters by providing additional wavelengths, modulations, or other beam characteristics. Alternatively, the same number of beams can be packed at the FAT into a smaller area, thereby reduced the numerical aperture of the beam provided by the objective lens.

Figure 4:
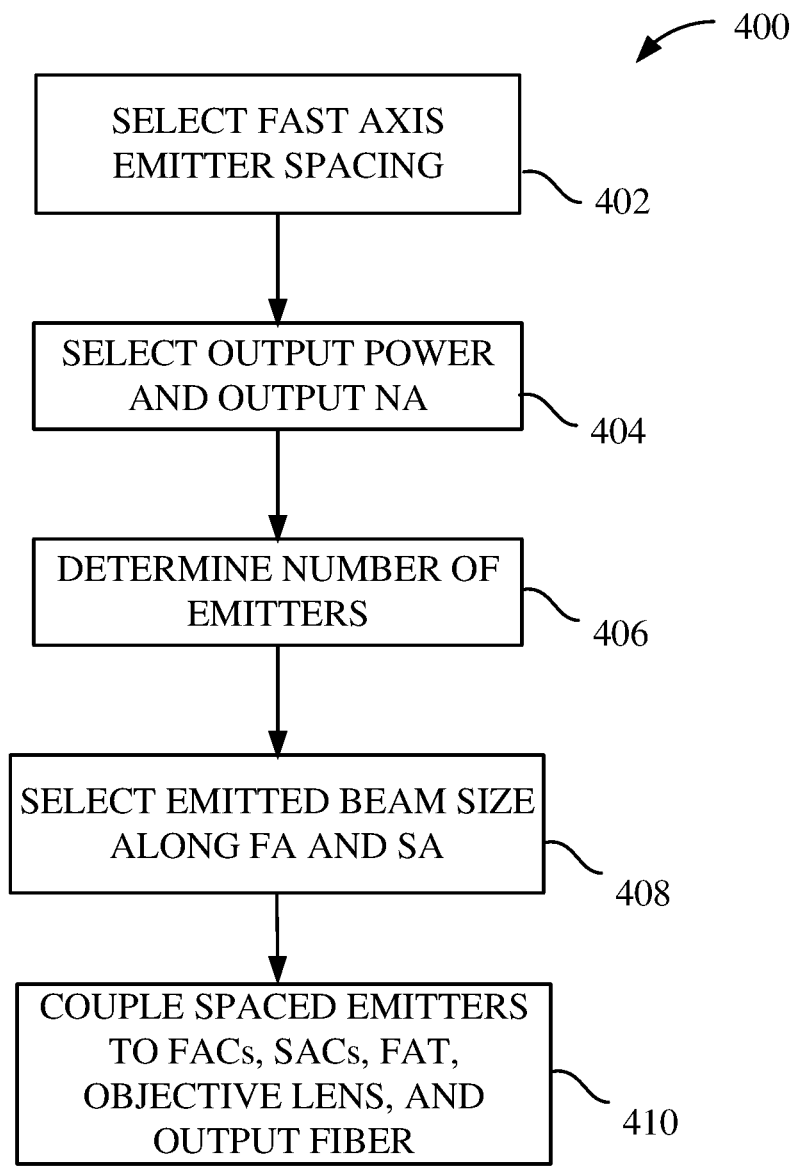
FIG. 4 illustrates method of coupling multiple laser diode beams into an optical fiber.

Referring to FIG. 4, a method 400 includes selecting a fast axis emitter spacing at 402, typically based on an available stepped mount. At 404, an output power and output NA are selected, and at 406 a number of emitters is determined based on the selected output power. At 408, an emitted FA beam width is selected to permit combining the necessary number of emitters into the selected NA. At 410, beams from the spaced emitters are coupled to an output fiber with FACs, an FAT, and an objective lens so as to achieve the selected NA and power. Typically, FAC, FAT, and the objective lens are selected to magnify the emission region so as to fill a core of the optical fiber. In some cases, at 410, an emitted SA beam width or a slow axis dimension is selected for the slow axis BPP to be less than the maximum allowable fiber slow axis BPP, and to avoid COMD, and in some cases, SA beam width is increased to provide a suitable beam intensity.

A representative three laser based system 500 is illustrated in FIG. 5 with reference to an xyz-coordinate system shown in orientations 550, 555. For convenient illustration, folding of optical axes by mirrors are unfolded so as to remain straight. Thus, beam reflection by a tilted, planar surface is shown as continuing straight line beam propagation. Typical folded propagation paths are illustrated above, such as in FIG. 2A.

Laser diodes 502A-502C are separated by a common distance $d_{stair}$ along a fast axis direction (an x-direction as shown in FIG. 5) and emit beams that are collimated by respective FACs 504A-504C. FA collimated beams 506A-506C are directed to respective SACs 507A-507C so as to produce FA and SA collimated beams 508A-508C. As shown in FIG. 5, laser diodes emit beams that propagate along a z-axis and have axes of emission that are displaced along the fast axis direction (the x-direction as illustrated). Typically, the laser diodes 502A-502C are situated on a stairstep mount so that emission regions of the laser diodes 502A-502C are in a common plane parallel to an xy-plane. Generally, the laser diodes 502A-502C are offset along a slow axis direction (a y-direction as shown). The beams 506A-506C appear to contact each other, but are displaced along the y-axis so that there need not be clipping due to the FACs 504A-504C. As shown also, emitted beams from each of the laser diodes 502A-502C substantially fill the apertures of the FACs 504A-504C, respectively. The SACs 507A-507C are shown as being situated in a common plane that is parallel to the xy-plane, but can be distribution along beam axes or propagation as is convenient. In FIG. 5, the SACs are represented without curvature, as the SACs are generally cylindrical lenses without curvature in the xz-plane. The FA and SA collimated beams 508A-508C are directed to respective turning mirrors 509A-509C so as to produce collimated beams 515A-515C that propagate along a y-axis of the coordinate system 555. A FAT 513 decreases beam size along the fast axis (the x-direction) and produces output beams 512A-512C that are incident to an objective lens 516. In the example of FIG. 5A, the FA and SA collimated beams 515A-515C are not separated by gaps, and are incident to the FAT 513 without gaps. As a result, the output beams 512A-512C are not separated by gaps as input to the objective lens 516 as shown in FIG. 5C. In such an arrangement, individual beams are referred to as combined so as to fill a portion of an aperture of the objective lens 516.

In order to couple laser diode beam power into a selected optical fiber with a predetermined stair step size, fast axis beam dimensions are controlled with a combination of FAC focal length, FAT magnification, and objective lens focal length. These produce a magnification selected so that an individual beam is incident to an output fiber with a FA beam diameter corresponding to a fiber core diameter. Similarly, slow axis beam dimensions are established based on SAC focal length and the objective lens focal length which are generally selected so that an SA beam diameter corresponds to the fiber core diameter. Representative combinations are listed in Table 3 below for 2 by 9 configurations that provide a common excitation NA and common SA/FA magnifications.

TABLE 3

Representative Combinations Providing Common Combined Beam

| FA Dia (μm) | FA Div (deg.) | SA Dia (μm) | $d_{stair}$ (mm) | $f_{FAC}$ (mm) | $f_{SAC}$ (mm) | M | $f_o$ (mm) | SA Image Dia (μm) | FA Image Dia (μm) | Excitation NA |
|---|---|---|---|---|---|---|---|---|---|---|
| 1.34 | 57 | 125 | 0.5 | 0.35 | 12 | 0.45 | 8 | 83.3 | 68.1 | 0.15 |
| 1.34 | 57 | 125 | 0.5 | 0.35 | 26.67 | 1 | 17.78 | 83.3 | 68.1 | 0.15 |
| 1.34 | 57 | 125 | 0.43 | 0.30 | 22.86 | 1 | 15.24 | 83.3 | 68.1 | 0.15 |

In view of the many possible embodiments to which the principles of the disclosed technology may be applied, it should be recognized that the illustrated embodiments are only preferred examples and should not be taken as limiting the scope of the disclosure. We claim all that comes within the scope and spirit of the appended claims.

We claim:
1. An apparatus, comprising:
a set of laser diodes with a predetermined spacing with respect to a stacking axis, each laser diode having an emission region defining a fast axis and a slow axis that produces an emitted beam having a fast axis beam full width of less than 1.62 μm or a fast axis full width beam divergence of at least 48 degrees, wherein fast axes of each of the laser diodes are mutually parallel and are parallel to the stacking axis and slow axes of each of the laser diodes are mutually parallel and orthogonal to the stacking axis;
fast axis collimators (FACs) associated with each of the laser diodes, each of the fast axis collimators having common focal length, wherein emission regions of each of the laser diodes are coupled to a respective fast axis collimator so as to produce respective beams that are collimated along the fast axes;
a set of slow axis collimators (SACs) situated to receive respective beams from the FACs and produce beams that are collimated along the fast axes and the slow axes;
an afocal telescope situated to receive the fast axis and slow axis collimated beams from the fast axis collimators and the slow axis collimators and produce a fast axis beam spacing based on the predetermined spacing and a magnification M associated with the afocal telescope;
an objective lens situated to receive the fast axis and slow axis collimated beams from the afocal telescope, an optical fiber having a core situated to receive the fast axis and slow axis collimated beams from the objective lens, wherein the FACs and the objective lens have focal lengths $f_{FAC}$ and $f_O$, respectively, a magnification of the emission regions of the laser diodes at the fiber is $f_O/M_{FA}$, and a fast axis numerical aperture of the fast axis collimated beams is $NA_{FA}=(d_{stair} \times m \times M)/(2 \times f_O)$, wherein m is a number of laser diodes in the set and $d_{stair}$ is the predetermined spacing, wherein $f_{FAC}$ is between 200 μm and 400 μm, $f_O$ is between 5 mm and 12 mm, and M is less than 0.9.

2. The apparatus of claim 1, wherein M is less than 1.0.

3. The apparatus of claim 1, wherein each of the diodes of the set of laser diodes emits in a wavelength range of 800 nm to 1,000 nm, and the set of laser diodes consists of either 1) two sets of seven laser diodes that couple a total optical power of at least 160 W into the optical fiber, 2) two sets of nine laser diodes that couple a total optical power of at least 200 W in a beam of numerical aperture less than 0.15 into the optical fiber, wherein the optical fiber has a core diameter of 105 μm, 3) two sets of 15 laser diodes that couple a total optical power of at least 360 W in a beam of numerical aperture less than 0.18 into the optical fiber, wherein the optical fiber has a core diameter of 105 μm, or 4) two sets of 24 laser diodes that couple at least 800 W in a beam of numerical aperture less than 0.18 into the optical fiber, wherein the optical fiber has a core diameter of 200 μm.

4. The apparatus of claim 3, wherein the optical fiber has a core diameter of 105 μm or 200 μm.

5. The apparatus of claim 1, where the predetermined spacing is between 200 μm and 1,000 μm.

6. The apparatus of claim 1, wherein the laser diodes are distributed along a slow axis direction so as to have a fixed slow axis spacing.

7. The apparatus of claim 6, further comprising a set of reflectors corresponding to each of the laser diodes of the set of laser diodes, each reflector situated to receive a beam from a respective FAC and direct the beam to the objective lens so that propagation axes of the directed beams at the objective lens are parallel.

8. The apparatus of claim 7, wherein the SACs are situated to direct the fast axis (FA) and slow axis (SA) collimated beams to respective reflectors.

9. The apparatus of claim 1, wherein the laser diodes are flared laser diodes.

10. The apparatus of claim 1, wherein each of the diodes of the set of laser diodes emits in a wavelength range of 800 nm to 1,000 nm.

11. An optical beam source, comprising:
a set of laser diodes situated to have a predetermined spacing along respective fast axes that are mutually parallel, each laser diode defined by a fast axis beam size less than 1.60 μm or a fast axis full width beam divergence of at least 48 degrees and having an emission region defining a fast axis and a slow axis, wherein fast axes of each of the laser diodes are mutually parallel and orthogonal to the stacking axis and slow axes of each of the laser diodes are mutually parallel and orthogonal to the stacking axis, wherein each of the diodes of the set of laser diodes emits in a wavelength range of 800 nm to 1,000 nm;
fast axis collimators (FACs) and slow axis collimators (SACs) corresponding to each of the laser diodes of the set, each of the FACs have a common focal length $f_{FAC}$ and each of the SACs having a common focal length $f_{SAC}$, wherein the FACs and SACs are situated to collimate optical beams emitted from respective emission regions of each of the laser diodes;
an afocal telescope situated to receive the collimated beams and produce a fast axis beam spacing based on the predetermined spacing and a magnification M associated with the afocal telescope; and
an objective lens situated to receive the beams from the afocal telescope and direct the beams to a focus, wherein the FACs and the objective lens have focal lengths $f_{FAC}$ and $f_O$, respectively, a magnification of the emission regions of the laser diodes at the focus is $f_O/Mf_{FA}$, and a fast axis numerical aperture of fast axis collimated beams is $NA_{FA}(d_{stair} \times m \times M)/(2 \times f_O)$, wherein m is a number of laser diodes in the set and $d_{stair}$ is the predetermined spacing.

12. The optical beam source of claim 11, further comprising an optical fiber having an input surface situated at the focus of the objective lens.

13. The optical beam source of claim 12, wherein the optical fiber has a core diameter of between 50 μm and 1.0 mm.

14. The optical beam source of claim 11, further comprising a laser diode mount having a plurality of thermally conductive steps, each of the laser diodes being secured to a respective step so as to be spaced apart along respective fast axes.

15. The optical beam source of claim 11, wherein the laser diodes are flared laser diodes.

16. An apparatus, comprising:
a set of laser diodes with a predetermined spacing with respect to a stacking axis, each laser diode having an emission region defining a fast axis and a slow axis that produces an emitted beam having a fast axis beam full width of less than 1.62 μm or a fast axis full width beam divergence of at least 48 degrees, wherein fast axes of each of the laser diodes are mutually parallel and are parallel to the stacking axis and slow axes of each of the laser diodes are mutually parallel and orthogonal to the stacking axis, wherein the laser diodes are flared laser diodes;

fast axis collimators (FACs) associated with each of the laser diodes, each of the fast axis collimators having a common focal length, wherein emission regions of each of the laser diodes are coupled to a respective fast axis collimator so as to produce respective beams that are collimated along the fast axes;

a set of slow axis collimators (SACs) situated to receive respective beams from the FACs and produce beams that are collimated along the fast axes and the slow axes;

an afocal telescope situated to receive the fast axis and slow axis collimated beams from the fast axis collimators and the slow axis collimators and produce a fast axis beam spacing based on the predetermined spacing and a magnification M associated with the afocal telescope;

an objective lens situated to receive the fast axis and slow axis collimated beams from the afocal telescope, an optical fiber having a core situated to receive the fast axis and slow axis collimated beams from the objective lens, wherein the FACs and the objective lens have focal lengths $f_{FAC}$ and $f_O$, respectively, a magnification of the emission regions of the laser diodes at the fiber is $f_O/Mf_{FA}$, and a fast axis numerical aperture of the fast axis collimated beams is $NA_{FA}=(d_{stair} \times m \times M)/(2 \times f_O)$, wherein m is a number of laser diodes in the set and $d_{stair}$ is the predetermined spacing.

\* \* \* \* \*